US012724043B2

(12) United States Patent
Tsujimoto

(10) Patent No.: US 12,724,043 B2
(45) Date of Patent: Sep. 1, 2026

(54) CURRENT SENSOR

(71) Applicant: Asahi Kasei Microdevices Corporation, Tokyo (JP)

(72) Inventor: Masaki Tsujimoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 110 days.

(21) Appl. No.: 18/900,870

(22) Filed: Sep. 29, 2024

(65) Prior Publication Data

US 2025/0110155 A1 Apr. 3, 2025

(30) Foreign Application Priority Data

Sep. 28, 2023 (JP) ................................ 2023-166640
Sep. 25, 2024 (JP) ................................ 2024-165799

(51) Int. Cl.
*G01R 15/20* (2006.01)
*G01R 19/00* (2006.01)
*G01R 19/25* (2006.01)

(52) U.S. Cl.
CPC ......... *G01R 15/20* (2013.01); *G01R 19/0092* (2013.01)

(58) Field of Classification Search
CPC ......... G01R 15/20; G01R 19/00; G01R 19/25
See application file for complete search history.

(56) References Cited

U.S. PATENT DOCUMENTS

| | | | |
|---|---|---|---|
| 11,385,301 B2 | 7/2022 | Hoegerl | |
| 2014/0167736 A1 | 6/2014 | Suzuki | |
| 2016/0187388 A1 | 6/2016 | Suzuki | |
| 2017/0160313 A1* | 6/2017 | Koiwa | G01R 15/20 |
| 2023/0245957 A1 | 8/2023 | Tuncer | |

FOREIGN PATENT DOCUMENTS

| | | | | |
|---|---|---|---|---|
| DE | 102004021862 A1 * | 12/2005 | | G01R 15/207 |
| JP | 2016223808 A | 12/2016 | | |
| JP | 2017134022 A | 8/2017 | | |
| JP | 2018036237 A | 3/2018 | | |
| JP | 2021015116 A | 2/2021 | | |

* cited by examiner

*Primary Examiner* — Neel D Shah

(57) ABSTRACT

A current sensor comprises a first lead frame, a signal processing IC, first and second magnetoelectric conversion elements, and a second lead frame that partially surrounds the first and second magnetoelectric conversion elements. In a plan view, the first and second magnetoelectric conversion elements may oppose each other with an intermediate portion, through which a current flows in a second direction that intersects with a first direction from the first magnetoelectric conversion element toward the second magnetoelectric conversion element, sandwiched therebetween. First wires may extend in a direction different from the second magnetoelectric conversion element side in the plan view, and be electrically connected to the signal processing IC without traversing the second lead frame. Second wires may extend in a direction different from the first magnetoelectric conversion element side in the plan view, and be electrically connected to the signal processing IC without traversing the second lead frame.

20 Claims, 12 Drawing Sheets

10

140
130c
141
142
130b
130
150
152a
154
155
108
142b
100
22b
23b
20b
A
A
Wy
Wx
20a
22a
23a
143
142a
130a
152
151
130d
150

10

10

10

CURRENT SENSOR

The contents of the following patent application(s) are incorporated herein by reference:

NO. 2023-166640 filed in JP on Sep. 28, 2023

NO. 2024-165799 filed in JP on Sep. 25, 2024

BACKGROUND

1. Technical Field

The present invention relates to a current sensor.

2. Related Art

Patent document 1 describes "a current sensor comprising a primary conductor that is penetrated by an aperture from the top face to the bottom face and in which the measured current flows, a lead frame electrically separated from the primary conductor and having a part overlapping the aperture of the primary conductor, and a magnetism sensor that is arranged in a position overlapping the aperture of the primary conductor on the lead frame and detects the measured current".

PRIOR ART DOCUMENTS

Patent Document

Patent Document 1: Japanese Patent Application Publication No. 2018-036237

DESCRIPTION OF EXEMPLARY EMBODIMENTS

Hereinafter, embodiments of the present invention will be described. However, the following embodiments are not for limiting the invention according to the claims. In addition, not all of the combinations of features described in the embodiments are essential to the solution of the invention.

Figure 1A:
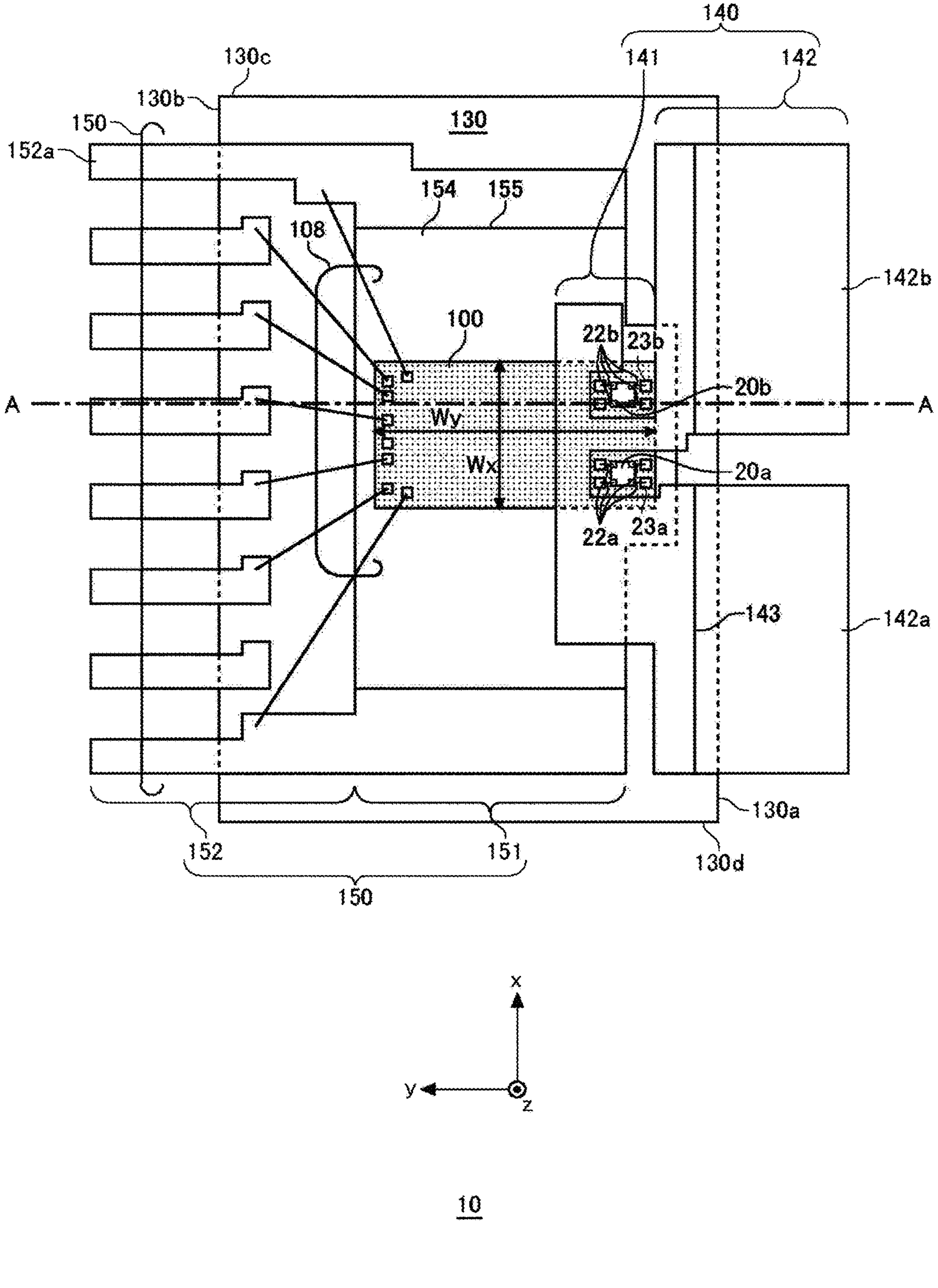
FIG. 1A is a schematic plan view of a current sensor according to a first embodiment as viewed from a ceiling surface side (Z axis direction).
Figure 1B:
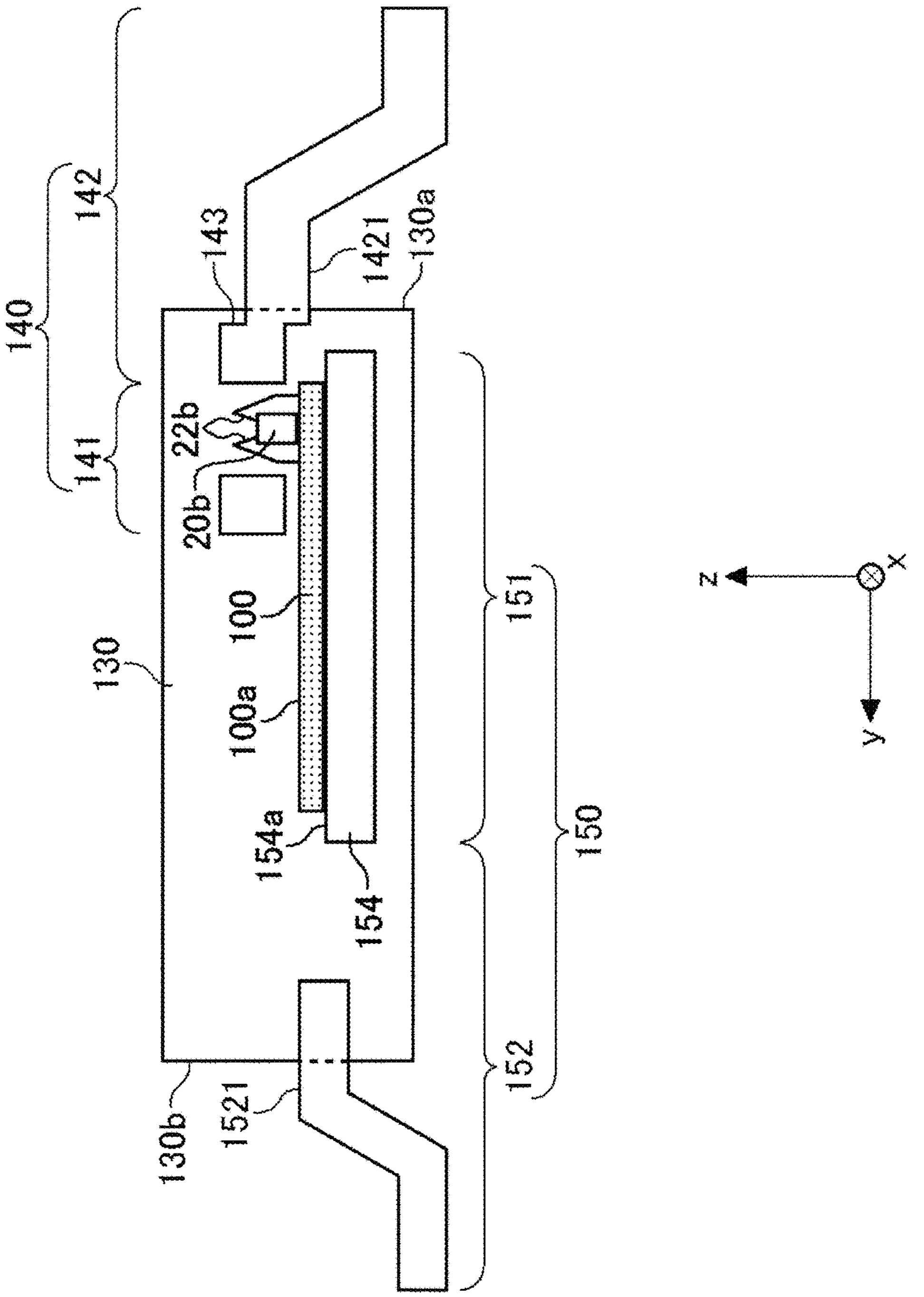
FIG. 1B is an A-A line sectional view of the current sensor 10 shown in FIG. 1A.

FIG. 1A and FIG. 1B show the internal configuration of a semiconductor package that serves as a current sensor 10 according to the first embodiment. FIG. 1A is a schematic plan view of the current sensor 10 according to the first embodiment as viewed from the ceiling surface side (Z axis direction). FIG. 1B is an A-A line sectional view of the current sensor 10 shown in FIG. 1A.

For the coordinates, in FIG. 1A, the X axis direction is defined as a direction from bottom to top and parallel to the document, the Y axis direction is defined as a direction from right to left and parallel to the document, and the Z axis direction is defined as a direction from back to front and perpendicular to the document. Any one axis among the X axis, Y axis, and the Z axis is orthogonal to another axis.

The current sensor 10 comprises a signal processing IC 100, a magnetoelectric conversion element 20*a*, a magnetoelectric conversion element 20*b*, a lead frame 140 on the current conductor side, a lead frame 150 on the signal terminal side, and a encapsulating part 130.

The lead frame 140 includes a conductor 141 and a terminal portion 142. The terminal portion 142 includes a pair of terminals 142*a*, 142*b*. The conductor 141 is encapsulated in the encapsulating part 130, and partially surrounds the magnetoelectric conversion element 20*a* and the magnetoelectric conversion element 20*b* along with a part of the terminal portion 142. A measurement current flows through the terminal portion 142 and the conductor 141. The pair of terminals 142*a*, 142*b* are physically configured integrally with the conductor 141, and at least a part thereof is exposed outside the encapsulating part 130. The lead frame 140 is an example of the second lead frame.

The lead frame 140 does not need to be manufactured by using the conductor 141 and the terminal portion 142 in a form in which a plurality of each component are arranged consecutively, and may be manufactured by using metal parts in a single pieces.

The lead frame 150 includes an IC suspension part 151 and a terminal portion 152. The terminal portion 152 includes a plurality of terminals 152*a*. The IC suspension part 151 is encapsulated in the encapsulating part 130 and supports the signal processing IC 100. The plurality of terminals 152*a* are physically configured integrally with the IC suspension part 151, and at least a part thereof is exposed outside the encapsulating part 130. The lead frame 150 is an example of a first lead frame. The lead frame 140 and the lead frame 150 may be composed of a conductor material principally made of copper. The X axis is a direction along faces of the lead frame 140 and the lead frame 150, in which the plurality of terminals 152*a* are arranged. The Y axis is a direction along faces of the lead frame 140 and the lead frame 150, which intersects with the X axis. The Y axis is a direction in which the plurality of terminals 152*a* and the pair of terminals 142*a*, 142*b* extend in the plan view. The Z axis is a direction that intersects with faces of the lead frame 140 and the lead frame 150, which is also a direction that intersects with a circuit face of the signal processing IC 100 and a thickness direction of the encapsulating part 130.

The pair of terminals 142*a*, 142*b* and the plurality of terminals 152*a* are arranged to oppose each other via the signal processing IC 100 in a direction (Y axis direction) that intersects with the thickness direction (Z axis direction) of the signal processing IC 100. The pair of terminals 142*a*, 142*b* are exposed from a side surface 130*a* of the encapsulating part 130. The plurality of terminals 152*a* are exposed from a side surface 130*b*, which is a side opposite to the side surface 130*a* of the encapsulating part 130. As shown in FIG. 1B, the pair of terminals 142*a*, 142*b* and the plurality of terminals 152*a* may protrude from different heights from each other in the thickness direction of the encapsulating part 130 of the side surface 130*a* and side surface 130*b*, which oppose each other, of the encapsulating part 130, toward the outside. The height of the encapsulating part 130 in the thickness direction (Z axis direction) in a face 1521, on a same side as the face 100*a* of the signal processing IC 100, of the plurality of terminals 152*a* at a position where they intersect with the side surface 130*b* of the encapsulating part 130 and the height of the encapsulating part 130 in the thickness direction (Z axis direction) in a face 1421, on a same side as the face on an opposite side of the face 100*a* of the signal processing IC 100, of the pair of terminals 142*a*, 142*b* at a position where they intersect with the side surface 130*a* of the encapsulating part 130 may be the same. Alternatively, the height of the encapsulating part 130 in the thickness direction (Z axis direction) in a face 1521 of the plurality of terminals 152*a* at a position where they intersect with the side surface 130*b* of the encapsulating part 130 may be positioned below the height of the encapsulating part 130 in the thickness direction (Z axis direction) in the face 1421 of the pair of terminals 142*a*, 142*b* at a position where they intersect with the side surface 130*a* of the encapsulating part 130.

The pair of terminals 142*a*, 142*b* protrude from the side surface 130*a* to the negative side in the Y axis direction, and are further bent to the negative side in the Z axis direction. The plurality of terminals 152*a* protrude from the side surface 130*b* to the positive side in the Y axis direction, and are further bent to the negative side in the Z axis direction. The pair of terminals 142*a*, 142*b* may protrude from the side surface 130*a* to the negative side in the Y axis direction, and may further be bent to the positive side in the Z axis direction. The plurality of terminals 152*a* may protrude from the side surface 130*b* toward the positive side in the Y axis direction, and may further be bent to the positive side in the Z axis direction. The pair of terminals 142*a*, 142*b*, and the plurality of terminals 152*a* may not be bent. That is, the pair of terminals 142*a*, 142*b* may protrude from the side surface 130*a* to the negative side in the Y axis direction, and not be bent to the positive side nor the negative side in the Z axis direction. The plurality of terminals 152*a* may protrude from the side surface 130*b* toward the positive side in the Y axis direction, and may not be further bent to the positive side nor the negative side in the Z axis direction.

The IC suspension part 151 includes a supporting portion 154 that supports the signal processing IC 100. The lead frame 150 may have a stepped part 155 that is recessed in a direction (a bottom face side of the encapsulating part 130) in which the supporting portion 154 moves away from the conductor 141 in the thickness direction (Z axis direction). The stepped part 155 is an example of a first stepped part. The signal processing IC 100 may be fixed on a face 154*a* of the supporting portion 154 via an adhesive layer. The adhesive layer may be a die attach film. The lead frame 140 has a stepped part 143 that protrudes in a direction in which an opposing portion that opposes the signal processing IC 100 moves away from the signal processing IC 100 in the thickness direction. The stepped part 143 is an example of a second stepped part. The stepped part 155 and the stepped part 143 may be formed through half blanking processing in the lead frame 150 and the lead frame 140.

Figure 1C:
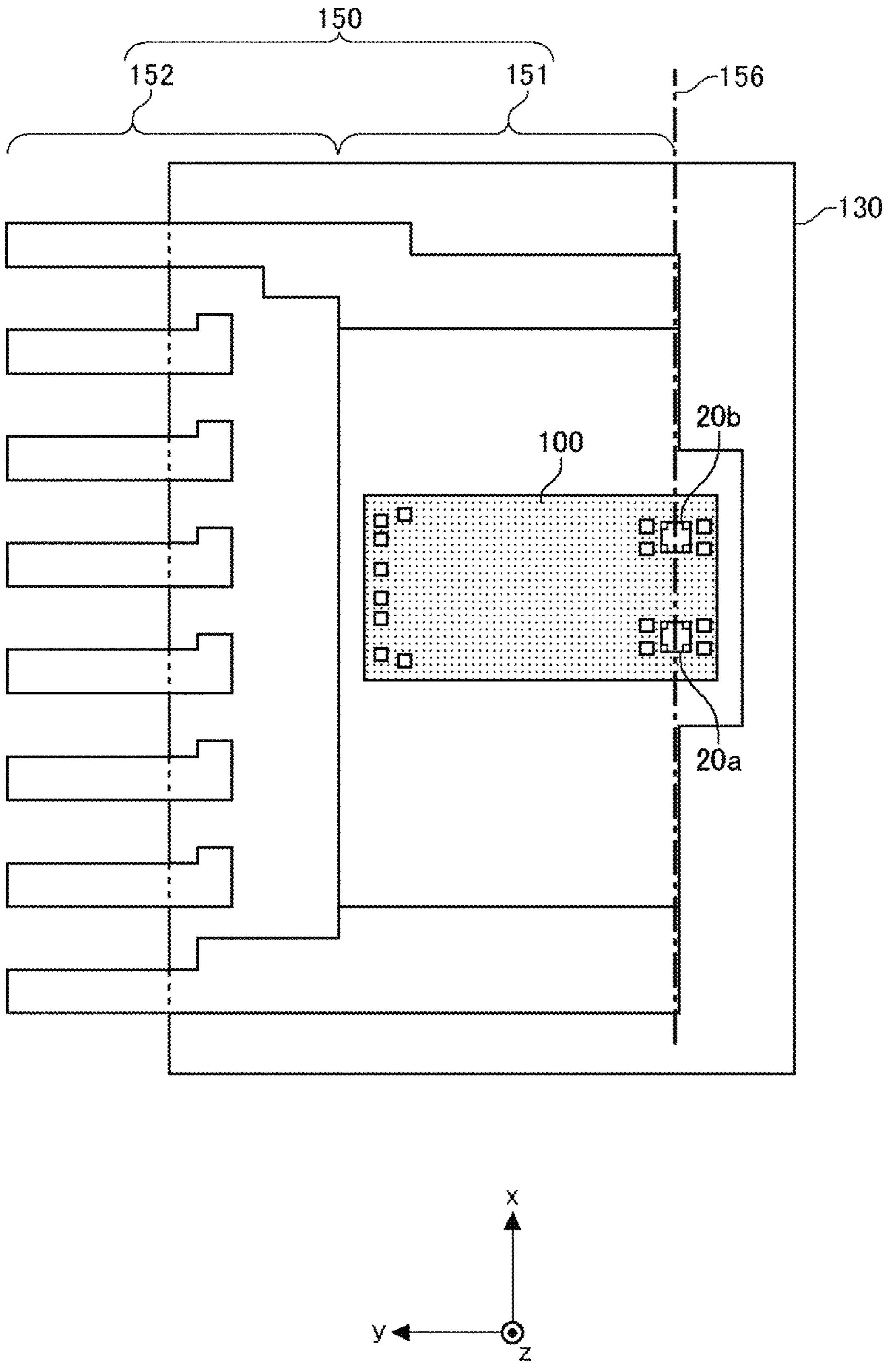
FIG. 1C is a view for describing a positional relationship between a lead frame on a signal terminal side and a magnetoelectric conversion element.

FIG. 1C is a view for describing a positional relationship between the lead frame 150 and the magnetoelectric conversion elements 20*a*, 20*b* that constitute the current sensor 10 according to the first embodiment. As shown in FIG. 1C, a virtual line 156 that extends in the X direction from an end surface of the IC suspension part 151 on a terminal portion 142 side may pass through the center of the magnetoelectric conversion element 20*a* and the center of the magnetoelectric conversion element 20*b* in the plan view. In this manner, in a process of manufacturing the current sensor 10, the magnetoelectric conversion element 20*a* and the magnetoelectric conversion element 20*b* may be arranged such that the center thereof passes through the virtual line 156. Therefore, the positional accuracy when arranging the magnetoelectric conversion element 20*a* and the magnetoelectric conversion element 20*b* above the signal processing IC 100 can be improved. The virtual line 156 may be defined by steps, cutouts, and through-holes formed in the IC suspension part 151, instead of the end surface of the IC suspension part 151.

The stepped part 143 preferably protrudes, relative to the terminal portion 142, in the thickness direction by greater than 0 times and 0.6 times or less of the thickness Ta of the lead frame 140. By suppressing the height of the stepped part 143 to be in such a range, half blanking processing with high dimensional accuracy in both the height direction and the planar direction can be achieved, and as a result of designing with consideration for manufacturing variation, the distance between the conductor 141 and the signal processing IC 100 can be reduced.

The magnetoelectric conversion elements 20*a*, 20*b* are electrically connected to the signal processing IC 100 via a plurality of wires 22*a*, 22*b*. The magnetoelectric conversion elements 20*a* and 20*b* are configured separately from the signal processing IC 100, and output a signal processed by the signal processing IC 100 to the signal processing IC 100. The signal processing IC 100 is electrically connected to a plurality of terminals 152*a* via a wire 108. The wires 22*a* and 22*b* and the wire 108 may be formed of a conductor material containing Au, Ag, Cu, or Al as a main component. As shown in FIG. 1A, the signal processing IC 100 has a plurality of pads 23*a*, 23*b* on the face 100*a*, and by connecting the plurality of pad 23*a*, 23*b* with the plurality of wires 22*a*, 22*b*, the signal processing IC 100 is electrically connected to the magnetoelectric conversion elements 20*a*, 20*b*. The plurality of pads 23*a* are examples of the plurality of first pads, and the plurality of pads 23*b* are examples of a plurality of second pads. Each of the plurality of pads 23*a* connected to the plurality of wires 22*a* and the plurality of pads 23*b* connected to the plurality of wires 22*b* may not overlap with the lead frame 140 in the plan view. The plurality of pads 23*a* may be on the terminal portion 152 side and/or the terminal portion 142 side relative the magnetoelectric conversion element 20*a* in the plan view, and the plurality of pads 23*b* may be on the terminal portion 152 side and/or the terminal portion 142 side relative to the magnetoelectric conversion element 20*b* in the plan view.

The magnetoelectric conversion elements 20*a*, 20*b* may protrude from the face 100*a* of the signal processing IC 100 such that magnetosensitive surfaces of the magnetoelectric conversion elements 20*a*, 20*b* overlap with the conductor 141 in a side view. In this manner, the sensitivity of the magnetoelectric conversion elements 20*a*, 20*b* can be improved.

The magnetoelectric conversion elements 20*a*, 20*b* detects a magnetic field in a certain direction which changes according to the measurement current that flows through the conductor 141, and the signal processing IC 100 amplifies a signal according to a magnitude of the magnetic field and outputs the amplified signal via the terminal 152*a*. The magnetoelectric conversion elements 20*a* and 20*b* are composed of a compound semiconductor formed on a GaAs substrate, and may be chips cut out in a square or rectangular shape in a plan view from the Z axis direction.

The magnetoelectric conversion elements 20*a*, 20*b* may have a substrate constituted by silicon or a compound semiconductor and a magnetoelectric conversion unit provided on the substrate. The thickness of the substrate is adjusted by grinding a surface on the negative side in the Z axis direction. Since a magnetic field in the Z axis direction is to be detected, a horizontal Hall element, for example, is suitable to be used as the magnetoelectric conversion elements 20*a*, 20*b*. In addition, in a case where the magnetoelectric conversion elements 20*a* and 20*b* are arranged at positions where a magnetic field in any one axial direction on an XY plane is detected, for example, when the magnetoelectric conversion elements are arranged at positions where a magnetic field in the X axis direction is detected, magnetoresistive elements or flux gate elements are suitable as the magnetoelectric conversion elements 20*a* and 20*b*.

The signal processing IC 100 is a Large-scale Integration circuit (LSI). The signal processing IC 100 is a signal processing circuit comprised of a Si monolithic semiconductor formed on an Si substrate. The signal processing circuit processes output signals corresponding to the magnitudes of the magnetic field output from the magnetoelectric conversion elements 20*a* and 20*b*. The signal processing circuit corrects the measurement current that flows through the conductor 141 based on the output signals, and outputs an output signal indicating an accurate current value via the terminal 152*a*. The signal processing circuit reduces a noise component included in the output signal of the magnetoelectric conversion element 20*a* and the output signal of the magnetoelectric conversion element 20*b*, based on a difference between the output signal of the magnetoelectric conversion element 20*a* and the output signal of the magnetoelectric conversion element 20*b*, amplifies the output signal of the magnetoelectric conversion element 20*a* and the output signal of the magnetoelectric conversion element 20*b* in which the noise component is reduced, calculates the current value of the measurement current based on the amplified output signal, and outputs the output signal indicating the current value.

A width Wy of the signal processing IC 100 in the Y axis direction is longer than a width Wx of the signal processing IC 100 in the X axis direction. By using such a configuration, the wires 108 that connect the signal processing IC 100 to the plurality of terminals 152*a* can be moved away from the conductor 141. In this manner, the influence of the noise caused by a change in the current flowing through the conductor 141 on the signals output via the wire 108 can be suppressed.

Note that, if the influence of the noise caused by a change in the current flowing through the conductor 141 on the signals output via the wire 108 is within a permissible range, the width Wy of the signal processing IC 100 in the Y axis direction may be equal to or less than the width Wx of the signal processing IC 100 in the X axis direction.

Wiring included in a top layer on the face 100*a* side of the signal processing IC 100 is preferably arranged at a position that does not overlap with the magnetoelectric conversion element 20*a* and the magnetoelectric conversion element 20*b* in the thickness direction (Z axis direction). Alternatively, the wiring included in the top layer on the face 100*a* side of the signal processing IC 100 is arranged at a position that overlaps with the magnetoelectric conversion element 20*a* and the magnetoelectric conversion element 20*b* in the thickness direction (Z axis direction), and preferably has a width that overlaps with all of the magnetoelectric conversion element 20*a* and the magnetoelectric conversion element 20*b* in the plan view. In this manner, the unevenness in the portion in which the magnetoelectric conversion element 20*a* and the magnetoelectric conversion element 20*b* on the face 100*a* of the signal processing IC 100 are arranged can be eliminated. In this manner, the magnetoelectric conversion element 20*a* and the magnetoelectric conversion element 20*b* can be reliably adhered to the face 100*a* of the signal processing IC 100. Therefore, the magnetoelectric conversion element 20*a* and the magnetoelectric conversion element 20*b* are removed from the face 100*a* of the signal processing IC 100, and the influence of reliability thereof on the bonding part between adjacent wires 22*a*, 22*b* and the signal processing IC 100 can be suppressed.

The encapsulating part 130 encapsulates, with mold resin, the magnetoelectric conversion elements 20*a*, 20*b*, the conductor 141, the IC suspension part 151, portions of the terminal portion 142 other than the exposed portion, portions of the terminal portion 152 other than the exposed portion, the signal processing IC 100, the wires 22*a*, 22*b*, and the wire 108. The lead frame 140 is electrically insulated from the magnetoelectric conversion elements 20*a*, 20*b* and the signal processing IC 100 by the encapsulating part 130, and no interface between members exists. Therefore, electric discharge through an interface does not occur under use environment. The mold resin may be, for example, comprised of an epoxy-based thermosetting resin added with silica and formed into a semiconductor package by a transfer molding.

Note that, in the first embodiment, an example is described in which the current sensor 10 comprises two magnetoelectric conversion elements 20*a*, 20*b*. However, it is sufficient if the current sensor 10 includes one or more magnetoelectric conversion elements.

Figure 2A:
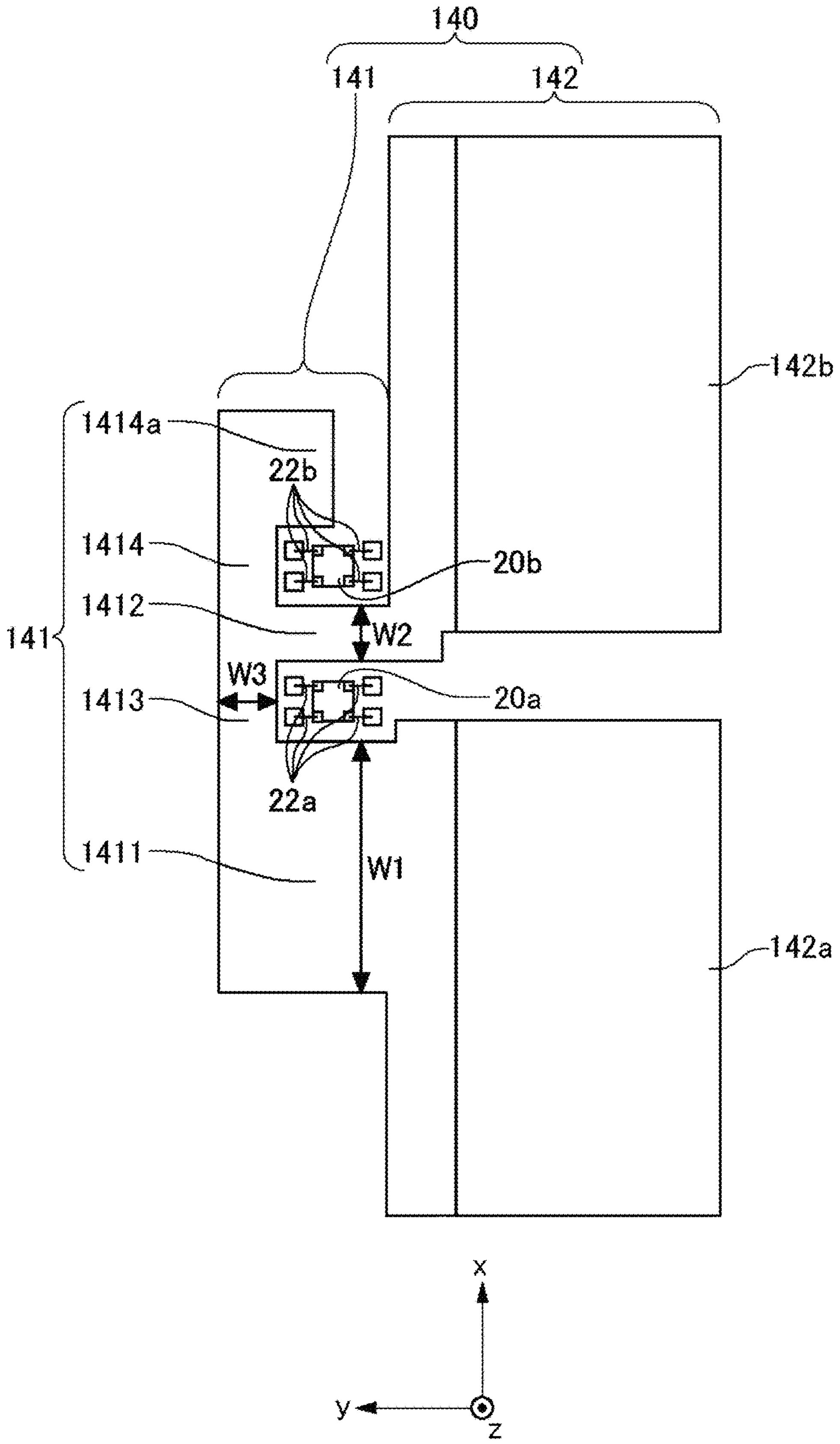
FIG. 2A is a schematic plan view of a lead frame on a current conductor side and the magnetoelectric conversion element as viewed from the ceiling surface side (Z axis direction).

FIG. 2A is a schematic plan view of the lead frame 140 and the magnetoelectric conversion elements 20*a*, 20*b* that constitute the current sensor 10 according to the first embodiment as viewed from the ceiling surface side (Z axis direction). The lead frame 140 has a first portion 1411, a second portion 1412, a linking portion 1413, and an extension portion 1414. The second portion 1412 is an example of the intermediate portion. The extension portion 1414 is an example of the first extension portion.

The first portion 1411 extends from the terminal 142*a* to the terminal portion 152 side (positive direction of the Y axis) in the Y axis direction. The second portion 1412 extends from the terminal 142*b* to the terminal portion 152 side (positive direction of the Y axis) in the Y axis direction. The linking portion 1413 extends from the first portion 1411 in the X axis direction that intersects with the Y axis direction, and is linked to the second portion 1412. The lead frame 140 further has an extension portion 1414*a* that extends from the extension portion 1414 to the terminal 142*b* side and is spaced apart from the terminal 142*b*. The extension portion 1414*a* is an example of a second extension portion. The direction that intersects with the Y axis direction may be a direction that is orthogonal to the Y axis direction, that is, a direction that forms an angle of 90 degrees with the Y axis direction. The direction that intersects with the Y axis direction may be a direction that forms an angle from 80 degrees to 100 degrees with the Y axis direction, or a direction that forms an angle of 85 degrees to 95 degrees with the Y axis direction.

Three side surfaces of the magnetoelectric conversion element 20*a* are surrounded by the first portion 1411, the linking portion 1413, and the second portion 1412 in the plan view. Three side surfaces of the magnetoelectric conversion element 20*b* are surrounded by the terminal 142*b*, the second portion 1412, and the extension portion 1414. The magnetoelectric conversion element 20*a* and the magnetoelectric conversion element 20*b* are arranged to oppose each other with the second portion 1412 sandwiched therebetween in the plan view.

The shape of the lead frame 140 that surrounds the three side surfaces of the magnetoelectric conversion element 20*a* and 20*b* is not limited to the shape shown in FIG. 2A.

Figure 2B:
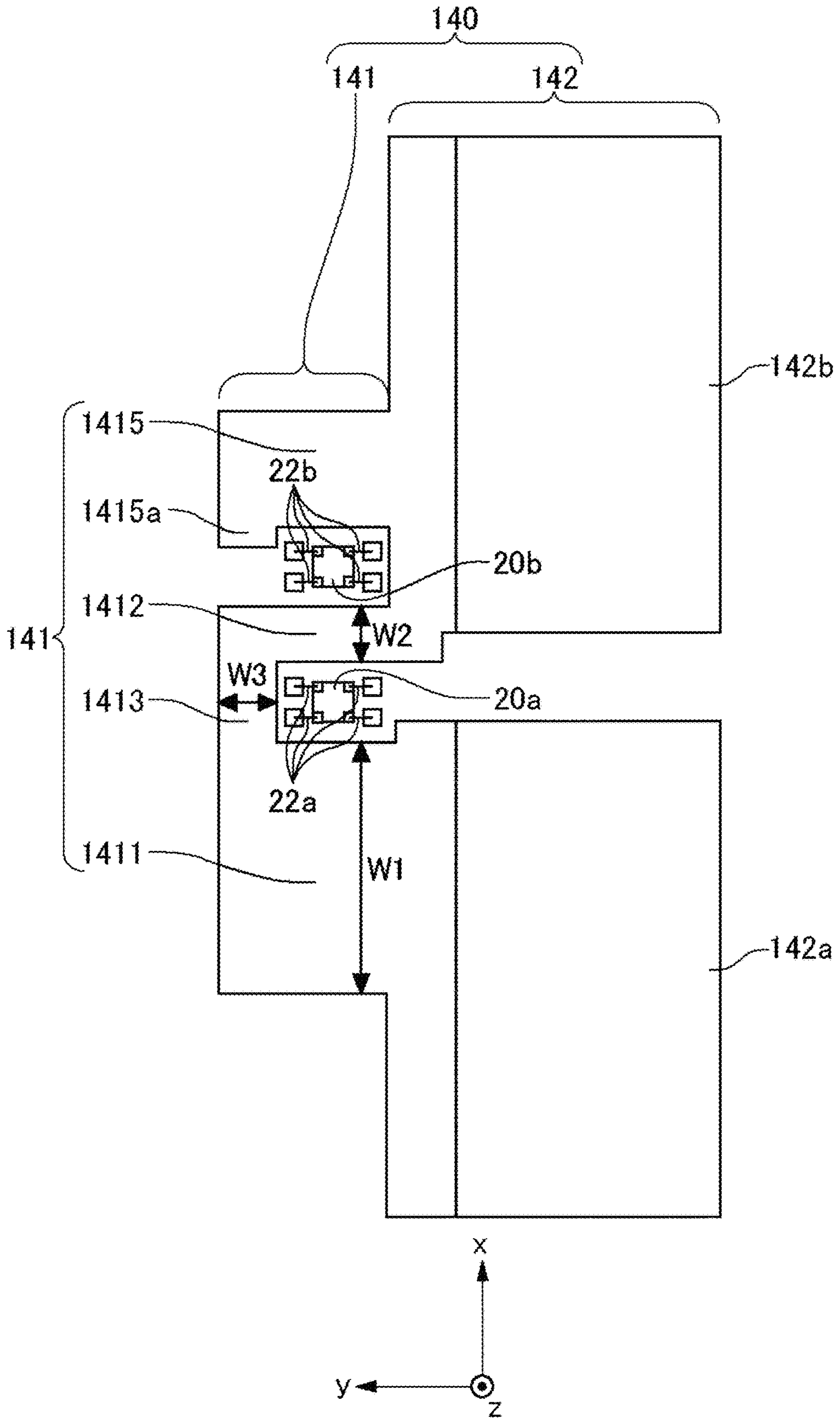
FIG. 2B is a schematic plan view of the lead frame on the current conductor side and the magnetoelectric conversion element according to a modified example as viewed from the ceiling surface side (Z axis direction).

FIG. 2B is a schematic plan view of the lead frame 140 and the magnetoelectric conversion elements 20*a*, 20*b* according to another example that constitutes the current sensor 10 according to the first embodiment as viewed from the ceiling surface side (Z axis direction).

The lead frame 140 has a first portion 1411, a second portion 1412, a linking portion 1413, and an extension portion 1415. The first portion 1411 extends from the terminal 142*a* to the terminal portion 152 side (positive direction of the Y axis) in the Y axis direction. The second portion 1412 extends from the terminal 142*b* to the terminal portion 152 side (positive direction of the Y axis) in the Y axis direction. The linking portion 1413 extends from the first portion 1411 in the X axis direction that intersects with the Y axis direction, and is linked to the second portion 1412. The lead frame 140 further has an extension portion 1415 that extends from the terminal 142*b* in the Y axis direction and surrounds the magnetoelectric conversion element 20*b* together with the terminal 142*b* and the second portion 1412. The second portion 1412 is an example of the intermediate portion. The extension portion 1415 is an example of the first extension portion. The lead frame 140 may further have an extension portion 1415*a* that extends from an end portion of the extension portion 1415 to the linking portion 1413 side and is spaced apart from the linking portion 1413.

In the lead frame 140 of both FIG. 2A and FIG. 2B, the width W2 of the second portion 1412 in the X axis direction is equal to or less than the width W1 of the first portion 1411 in the X axis direction. In this manner, each of the magnetoelectric conversion elements 20*a*, 20*b* can detect a change in the magnetic field caused by the current flowing through the second portion 1412 with a relatively narrow width. That is, since each of the magnetoelectric conversion elements 20*a*, 20*b* can detect the change in the magnetic field caused by relatively high current density, S/N of the current sensor 10 can be improved.

Further, the width W3 of the linking portion 1413 in the Y axis direction is equal to or less than the width W1 of the first portion 1411 in the X axis direction. In this manner, the overlapped region of the lead frame 140 and the signal processing IC 100 in the thickness direction can be reduced. Therefore, the influence on the signal processing IC 100 of the noise caused by the voltage change ΔV/Δt when the current is flowing through the lead frame 140 can be reduced. In addition, the width W3 of the linking portion 1413 in the Y axis direction may be equal to or more than the width W2 of the second portion 1412 in the X axis direction. In this manner, the current flowing through the second portion 1412 is concentrated and since the change in the magnetic field caused by relatively high current density can be detected at the magnetoelectric conversion elements 20*a*, 20*b*, S/N of the current sensor 10 can be improved.

Figure 2C:
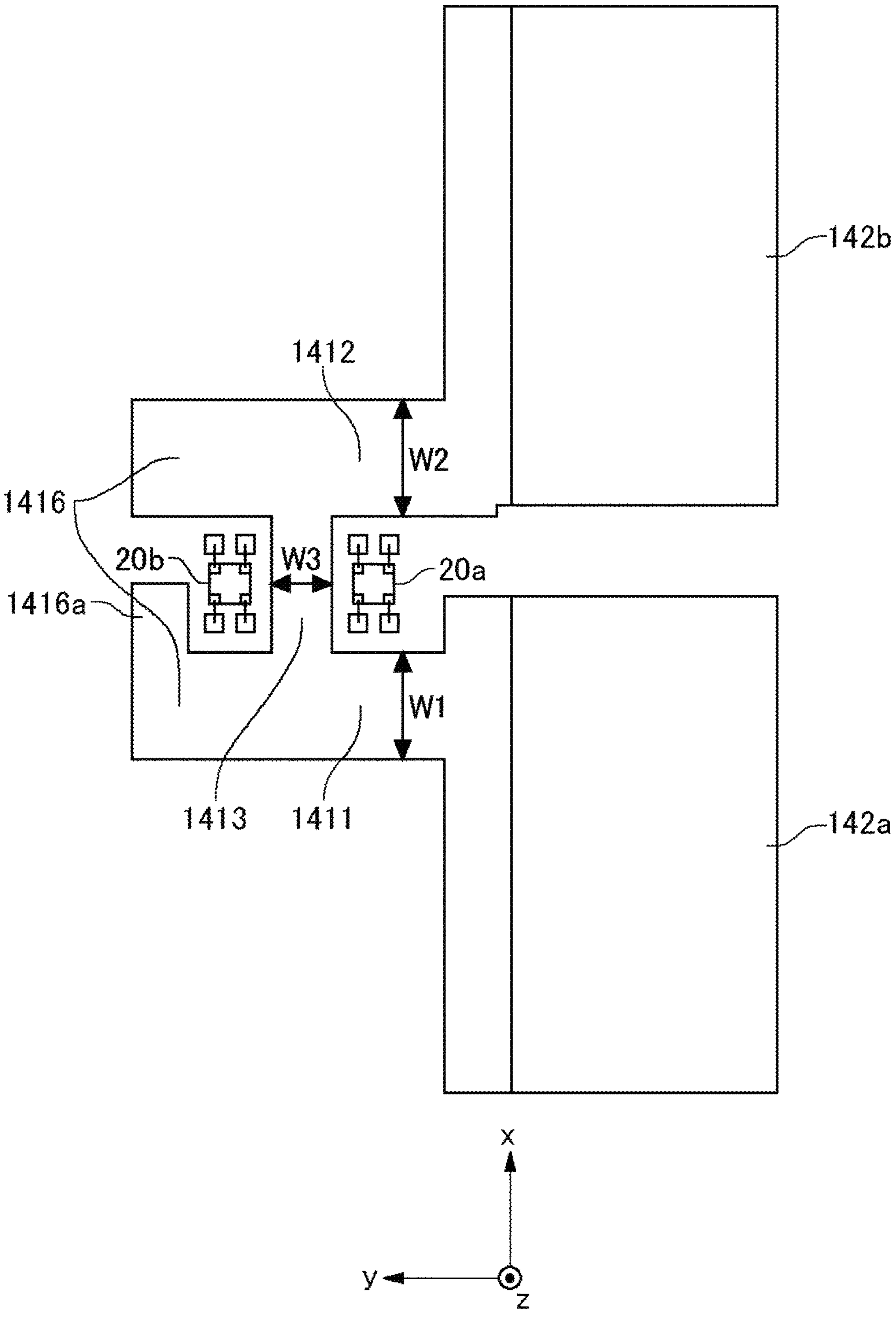
FIG. 2C is a schematic plan view of the lead frame on the current conductor side and the magnetoelectric conversion element according to a modified example as viewed from the ceiling surface side (Z axis direction).

FIG. 2C is a schematic plan view of the lead frame 140 and the magnetoelectric conversion elements 20*a*, 20*b* according to another example that constitutes the current sensor 10 according to the first embodiment as viewed from the ceiling surface side (Z axis direction).

The lead frame 140 has the first portion 1411, the second portion 1412, the linking portion 1413, and an extension portion 1416. The first portion 1411 extends from the terminal 142*a* to the terminal portion 152 side (positive direction of the Y axis) in the Y axis direction. The second portion 1412 extends from the terminal 142*b* to the terminal portion 152 side (positive direction of the Y axis) in the Y axis direction. The linking portion 1413 extends from the first portion 1411 in the X axis direction that intersects with the Y axis direction, and is linked to the second portion 1412. That is, the linking portion 1413 links the first portion 1411 and the second portion 1412. The lead frame 140 further has an extension portion 1416 that extends from the terminal 142*a* and the terminal 142*b* in the Y axis direction and surrounds the magnetoelectric conversion element 20*b* together with the linking portion 1413. The linking portion 1413 is an example of the intermediate portion. The extension portion 1416 is an example of the first extension portion. The lead frame 140 may further have an extension portion 1416*a* that extends from an end portion of the extension portion 1416 to another extension portion 1416 side and is spaced apart from the another extension portion 1416. The extension portion 1416*a* is an example of a second extension portion.

In FIG. 2C, the magnitude relationship between the width W1 of the first portion 1411 in the X axis direction and the width W2 of the second portion 1412 in the X axis direction may be arbitrary. Since the resistance value of the lead frame 140 can be reduced while securing a cross-sectional area of the heat dissipation path to be large by increasing the width W1 of the first portion 1411 in the X axis direction and the width W2 of the second portion 1412 in the X axis direction to be at a similar degree as the terminals 142*a*, 142*b*, a large current can be caused to flow.

In FIG. 2C, the width W3 of the linking portion 1413 in the Y axis direction is equal to or less than the width W1, W2 of the first portion 1411, the second portion 1412 in the X axis direction. By taking such a configuration, each of the magnetoelectric conversion elements 20*a*, 20*b* can detect the change in the magnetic field caused by the current flowing through the linking portion 1413 with a relatively narrow width. That is, since each of the magnetoelectric conversion elements 20*a*, 20*b* can detect the change in the magnetic field caused by relatively high current density, S/N of the current sensor 10 can be improved.

By surrounding the magnetoelectric conversion element 20*b* with the lead frame 140, similarly to the magnetoelectric conversion element 20*a*, as shown in FIG. 2A, FIG. 2B, and FIG. 2C, the binding capacitance between the wire 22*b* and the lead frame 140 can be set to be a value close to the binding capacitance between the wire 22*a* and the lead frame 140. Therefore, the influence of the noise caused by voltage change ΔV/Δt when the current is flowing through the lead frame 140 can be reduced.

Each of the plurality of wires 22*a* extends in a direction different from the magnetoelectric conversion element 20*b* side in the plan view, and is electrically connected to the signal processing IC 100 without traversing the lead frame 140. Each of the plurality of wires 22*a* may extend in a direction, among four directions, different from the direction from the magnetoelectric conversion element 20*a* toward the magnetoelectric conversion element 20*b* in the plan view, and may be electrically connected to the signal processing IC 100 without traversing the lead frame 140. Each of the plurality of wires 22*a* may extend in a direction, among four directions, from the magnetoelectric conversion element 20*a* and not toward the magnetoelectric conversion element 20*b* in the plan view. For example, each of the plurality of wires 22*a* extends in a direction different from a straight line connecting the magnetoelectric conversion element 20*a* and the magnetoelectric conversion element 20*b* in the plan view, and is electrically connected to the signal processing IC 100 without traversing the conductor 141 of the lead frame 140. Each of the plurality of wires 22*a* shown in FIG. 2A and FIG. 2B may extend along a direction in which the current flows through the second portion 1412, that is, along the Y axis direction in the plan view. Each of the plurality of wires 22*a* shown in FIG. 2C may extend along a direction in which the current flows through the linking portion 1413, that is, along the X axis direction in the plan view.

Each of the plurality of wires 22*b* extends in a direction different from the magnetoelectric conversion element 20*a* side in the plan view, and is electrically connected to the signal processing IC 100 without traversing the lead frame 140. Each of the plurality of wires 22*b* may extend in a direction, among four directions, different from the direction from the magnetoelectric conversion element 20*b* toward the magnetoelectric conversion element 20*a* in the plan view, and may be electrically connected to the signal processing IC 100 without traversing the lead frame 140. Each of the plurality of wires 22*b* may extend in a direction, among four directions, from the magnetoelectric conversion element 20*b* and not toward the magnetoelectric conversion element 20*a* in the plan view. For example, each of the plurality of wires 22*b* extends in a direction different from a straight line connecting the magnetoelectric conversion element 20*a* and the magnetoelectric conversion element 20*b* in the plan view, and is electrically connected to the signal processing IC 100 without traversing the conductor 141 of the lead frame 140. Each of the plurality of wires 22*b* shown in FIG. 2A and FIG. 2B may extend along a direction in which the current flows through the second portion 1412, that is, along the Y axis direction in the plan view. Each of the plurality of wires 22*b* shown in FIG. 2C may extend along a direction in which the current flows through the linking portion 1413, that is, along the X axis direction in the plan view.

Figure 3:
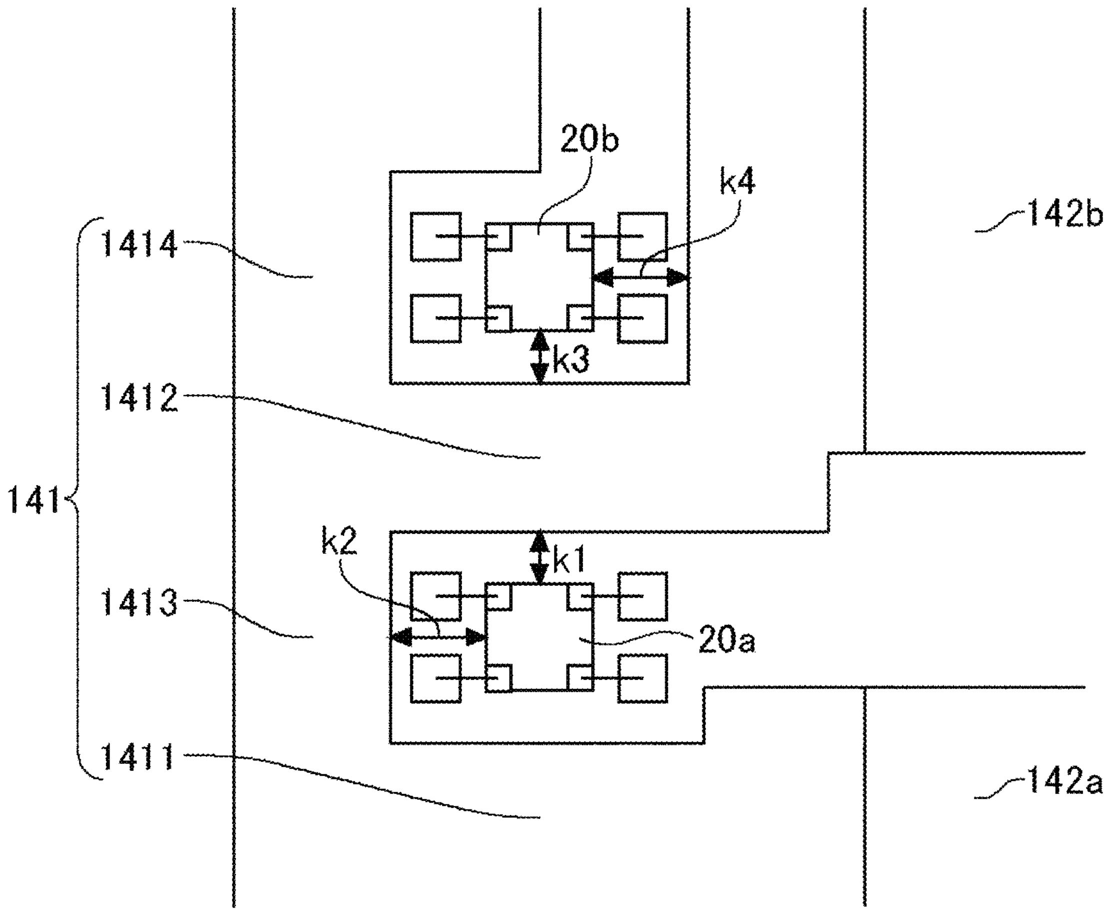
FIG. 3 is a view for describing a distance between the magnetoelectric conversion element and a conductor.

When the portion, among the second portion 1412 or the linking portion 1413, sandwiched between the magnetoelectric conversion elements 20*a*, 20*b* is defined as the intermediate portion, by extending each of the plurality of wires 22*a*, 22*b* in a direction, among four directions, that is not toward the magnetoelectric conversion elements 20*a*, 20*b* in the plan view, the distance between each of the magnetoelectric conversion elements 20*a*, 20*b* and the intermediate portion can be reduced. As shown in FIG. 3, the distance k1 between the magnetoelectric conversion element 20*a* and the intermediate portion is shorter than the distance k2 between the magnetoelectric conversion element 20*a* and the conductor 141 in the direction in which the wire 22*a* extends. In addition, the distance k3 between the magnetoelectric conversion element 20*b* and the intermediate portion is shorter than the distance k4 between the magnetoelectric conversion element 20*b* and the lead frame 140 in the direction in which the wire 22*b* extends.

In FIG. 2A, FIG. 2B, and FIG. 2C, the magnetoelectric conversion element 20*a* and the magnetoelectric conversion element 20*b* are rectangular in the plan view. In addition, in FIG. 2A and FIG. 2B, the second portion 1412 is rectangular, and in FIG. 2C, the linking portion 1413 is rectangular. In addition, in FIG. 2A and FIG. 2B, no wire and element exist in respective regions between a side surface, which opposes the second portion 1412, of each of the magnetoelectric conversion element 20*a* and the magnetoelectric conversion element 20*b* and side surfaces of the second portion 1412 each opposing the magnetoelectric conversion element 20*a* and the magnetoelectric conversion element 20*b* in the plan view. In addition, in FIG. 2C, in the plan view, no wire and element exists in respective regions between a side surface, which opposes the linking portion 1413, of each of the magnetoelectric conversion element 20*a* and the magnetoelectric conversion element 20*b* and side surfaces of the linking portion 1413 each opposing the magnetoelectric conversion element 20*a* and the magnetoelectric conversion element 20*b*. By taking such a configuration, the magnetosensitive surfaces of the magnetoelectric conversion elements 20*a*, 20*b* and the second portion 1412 or the linking portion 1413 can be brought closer.

In this manner, each of the magnetoelectric conversion elements 20*a*, 20*b* can easily detect the change in the magnetic field caused by the current flowing through the intermediate portion, and can efficiently improve sensitivity of the magnetoelectric conversion elements 20*a*, 20*b*.

Note that, if the sensitivity of the magnetoelectric conversion elements 20*a*, 20*b* satisfies the requested sensitivity, the distance k1 between the magnetoelectric conversion element 20*a* and the intermediate portion may be longer than the distance k2 between the magnetoelectric conversion element 20*a* and the conductor 141 in the direction in which the wire extends. In addition, the distance k3 between the magnetoelectric conversion element 20 and the intermediate portion may be longer than the distance k4 between the magnetoelectric conversion element 20*b* and the lead frame 140 in the direction in which the wire extends.

In addition, each of the plurality of wires 22*a*, 22*b* is electrically connected to the signal processing IC 100 without traversing the lead frame 140. That is, each of the plurality of wires 22*a*, 22*b* is electrically connected to the signal processing IC 100 without going over the lead frame 140. Therefore, the length of each of the plurality of wires 22*a*, 22*b* can be reduced. In this manner, the risk of the plurality of wires 22*a*, 22*b* being brought into contact with each other can be reduced. In addition, generation of induced electromotive force in each of the plurality of wires 22*a*, 22*b* caused by the current flowing through the lead frame 140 and generation of the noise in the outputs of the magnetoelectric conversion elements 20*a*, 20*b* can be suppressed.

Note that, as long as the sensitivity required for the magnetoelectric conversion elements 20*a*, 20*b* satisfies the required sensitivity, each of the plurality of wires 22*a*, 22*b* may be extended in a direction toward the magnetoelectric conversion elements 20*b*, 20*a*.

Figure 4:
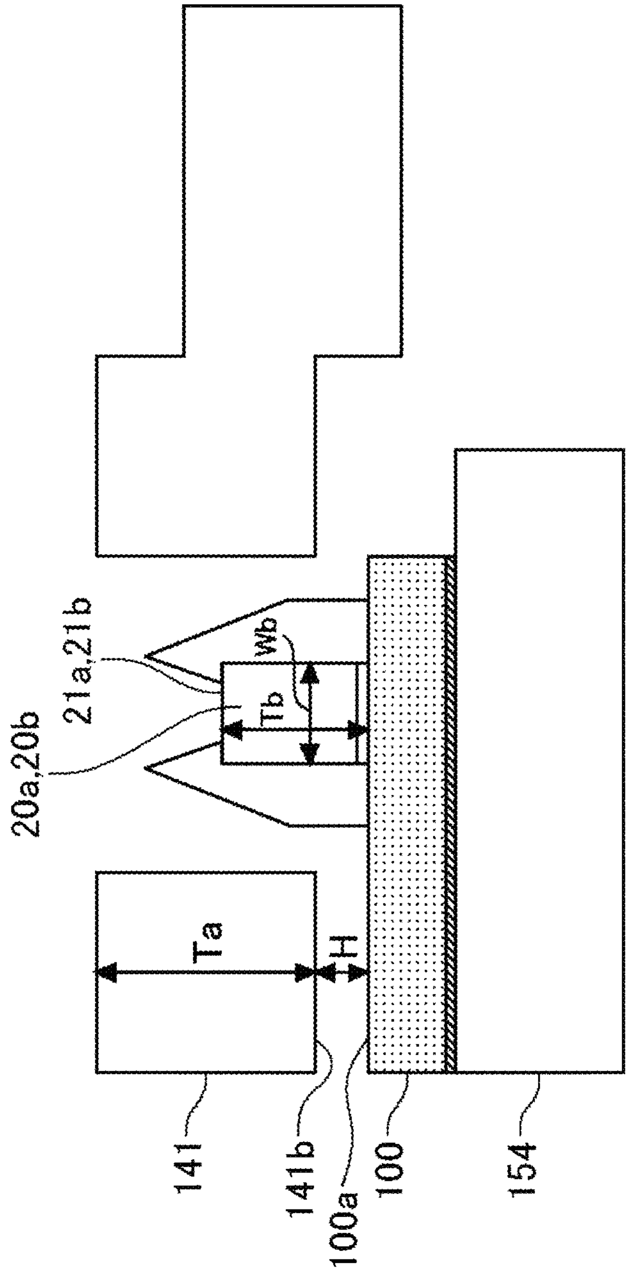
FIG. 4 is an enlarged view of a surrounding portion of the magnetoelectric conversion element of FIG. 1B.

Herein, as shown in FIG. 4, the magnetoelectric conversion elements 20*a*, 20*b* cannot be stably die-bonded on the signal processing IC 100 if the height Tb from the face 100*a* of the signal processing IC 100 to the magnetosensitive surfaces 21*a*, 21*b* of the magnetoelectric conversion elements 20*a*, 20*b* is not equal to or less than three times the width Wb of the magnetoelectric conversion elements 20*a*, 20*b*. In addition, when the magnetoelectric conversion element is a compound semiconductor, it is likely to break when it is thin. Therefore, a suitable Tb is 0.050 mm or more. That is, $0.050\ \text{mm}<Tb\leq 3\times Wb$ is preferably satisfied. The unit of the height Tb, and of the width Wb are mm.

Figure 5:
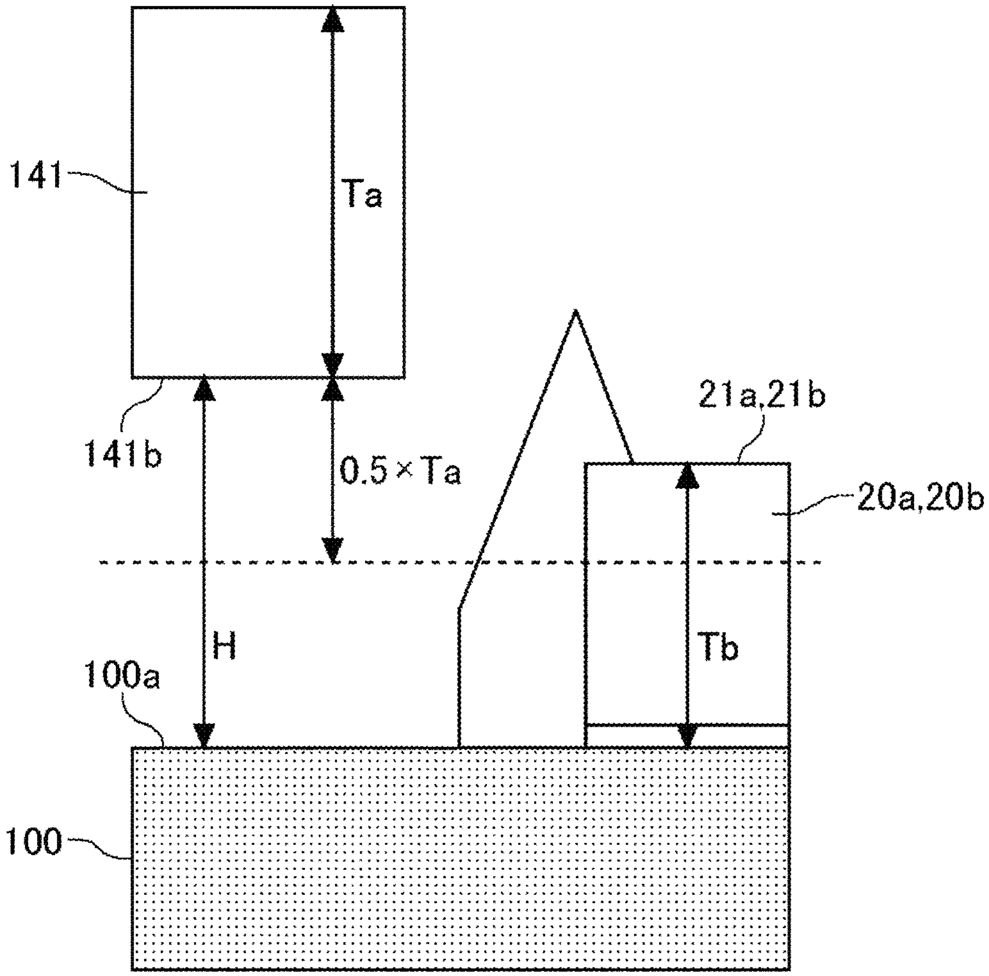
FIG. 5 is a view for describing a positional relationship between the lead frame on the current conductor side and the magnetoelectric conversion element.

In addition, in order to improve the sensitivity of the magnetoelectric conversion elements 20*a*, 20*b*, as shown in FIG. 5, the magnetosensitive surfaces 21*a*, 21*b* of the magnetoelectric conversion elements 20*a*, 20*b* are preferably arranged on a center side in the thickness direction of the conductor 141 relative to a place that is away from the face 141*b*, opposing the signal processing IC 100, of the conductor 141 by half of the thickness Ta of the conductor 141 $0.5\times Ta$ in the side view. Therefore, when the distance between the face 141*b* of the conductor 141 and the face 100*a* of the signal processing IC 100 is defined as H, H preferably satisfies $H\leq Tb+0.5\times Ta$, that is, $H\leq 3\times Wb+0.5\times Ta$. The unit of the distance H, of the height Tb, and of the width Wb are mm.

Figure 6:
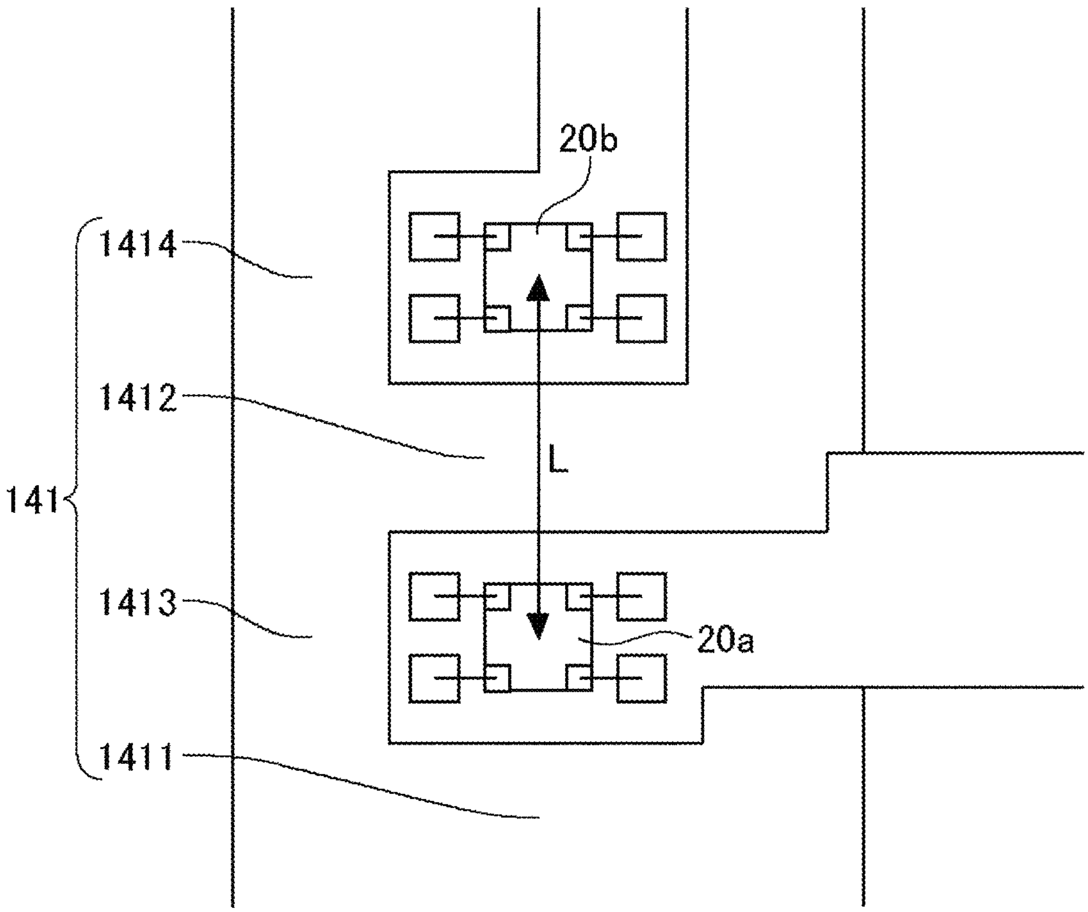
FIG. 6 is a view for describing a distance between magnetoelectric conversion elements.

On the other hand, in order to improve the sensitivity of the magnetoelectric conversion elements 20*a*, 20*b*, in the plan view, a distance in which a conductor 141 can be intervened between the magnetoelectric conversion element 20*a* and the magnetoelectric conversion element 20*b* is required to be secured for the distance between the magnetoelectric conversion element 20*a* and the magnetoelectric conversion element 20*b*. In addition, processing with stable shape is enabled by increasing the width of the conductor 141 to be greater than 0.5 times the thickness Ta of the conductor 141. Therefore, as shown in FIG. 6, when the distance between the center of the magnetoelectric conversion element 20*a* and the center of the magnetoelectric conversion element 20*b* is defined as L, $0.5\times Ta+Wb<L$ is preferably satisfied. The unit of the thickness Ta, of the width Wb, and of the distance L are mm. In this manner, a conductor 141 with stable dimensions between the magnetoelectric conversion element 20*a* and the magnetoelectric conversion element 20*b* can be arranged, and the sensitivity of the magnetoelectric conversion elements 20*a*, 20*b* can be improved.

Taking the above into consideration, $\frac{1}{6}\times Ta+\frac{1}{3}\times H<L$, that is, $H<3\times L-0.5\times Ta$ is preferably satisfied. Herein, H is a critical distance for securing withstand voltage even when a high voltage is applied between the conductor 141 and the signal processing IC 100. Since H is required to be at least 0.01 mm or more, by taking tolerance of step errors into consideration, $0.01\ \text{mm}<H<3\times L-0.5\times Ta$ is preferably satisfied. The unit of the distance H, of the distance L, and of the thickness Ta are mm.

Figure 7A:
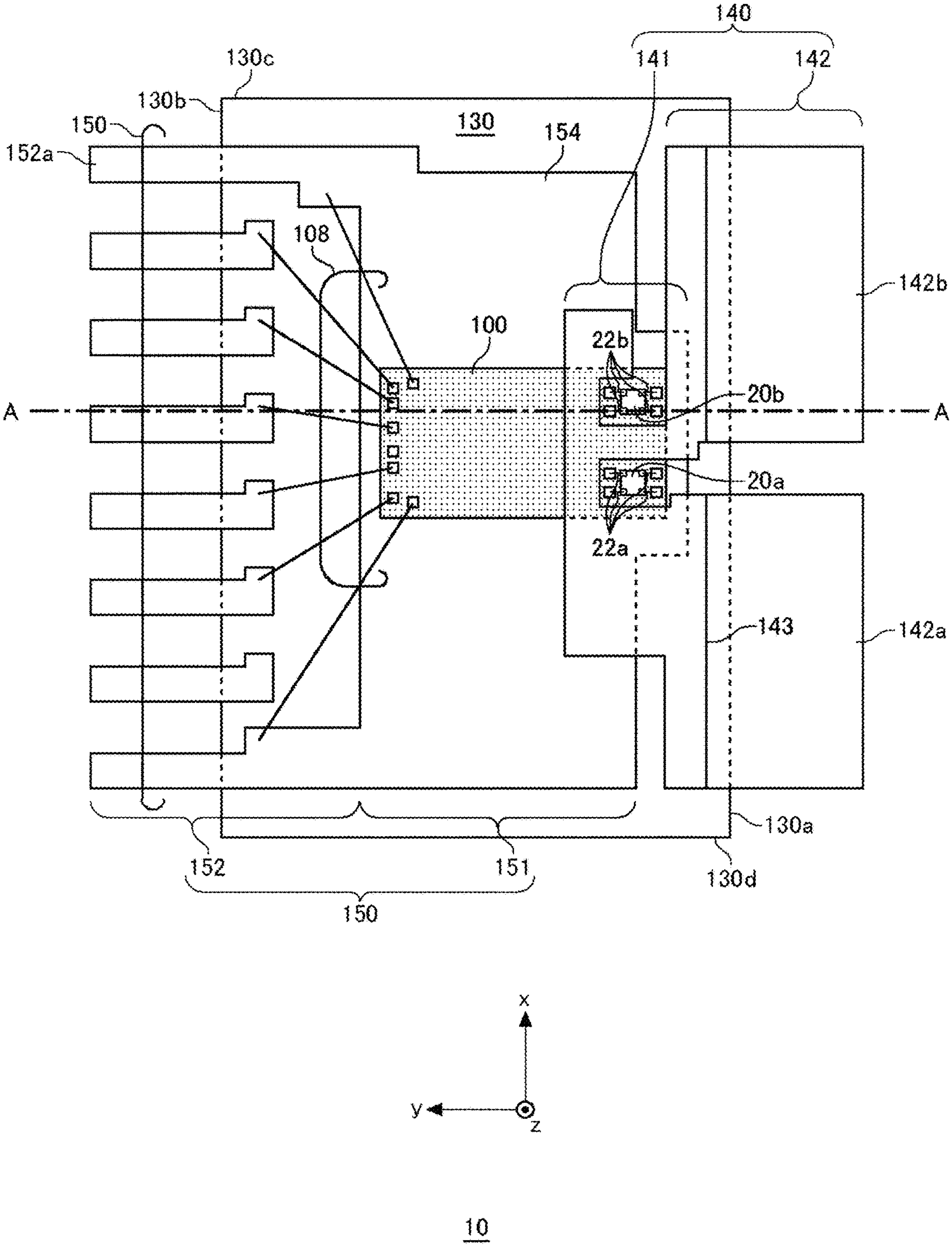
FIG. 7A is a schematic plan view of a current sensor according to a second embodiment as viewed from a ceiling surface side (Z axis direction).
Figure 7B:
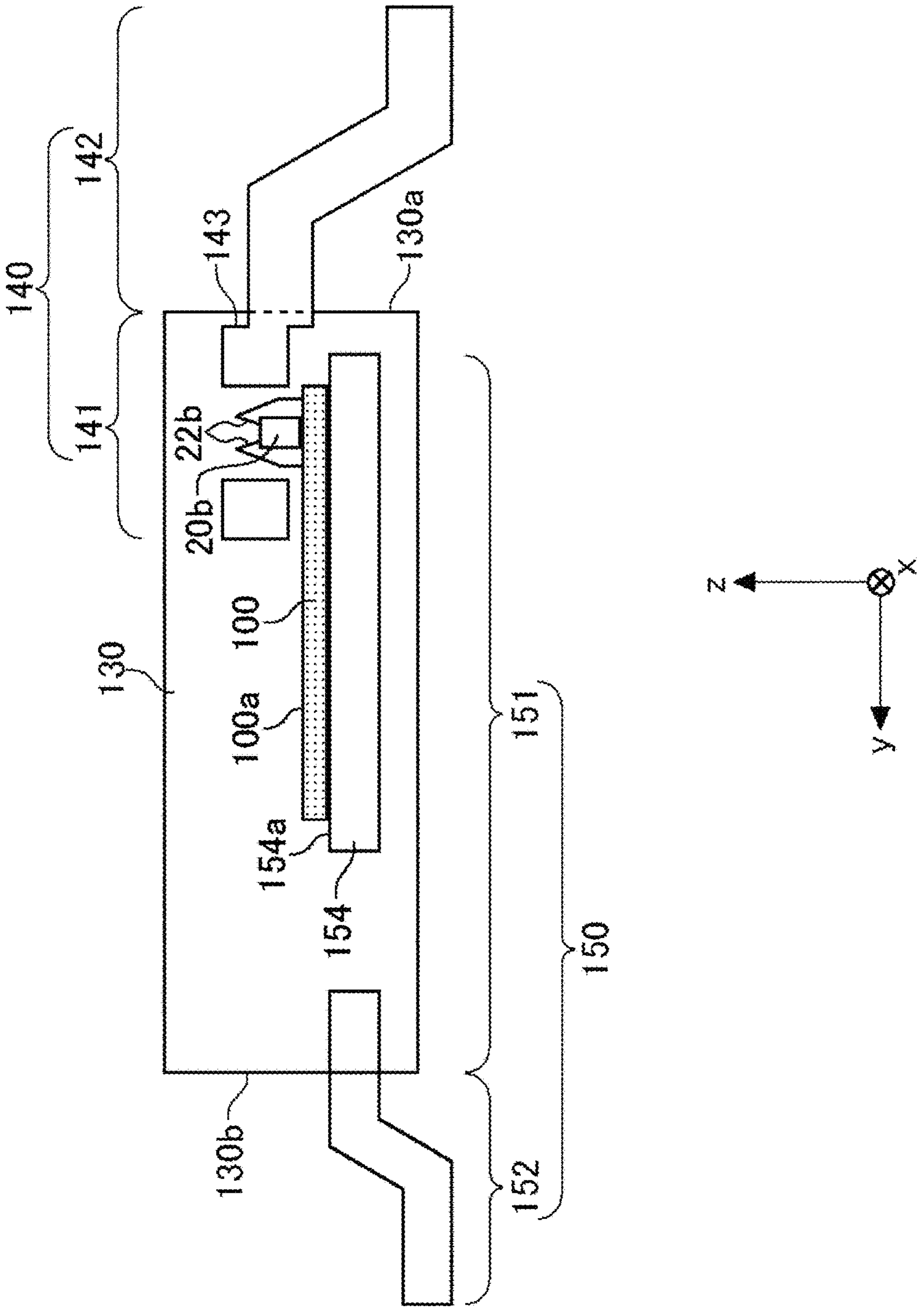
FIG. 7B is an A-A line sectional view of the current sensor shown in FIG. 7A.

FIG. 7A and FIG. 7B show the internal configuration of a semiconductor package that serves as a current sensor 10 according to the second embodiment. FIG. 7A is a schematic plan view of the current sensor 10 according to the second embodiment as viewed from the ceiling surface side (Z axis direction). FIG. 7B is an A-A line sectional view of the current sensor 10 shown in FIG. 7A.

The current sensor 10 according to a second embodiment is different from the current sensor 10 according to the first embodiment in that the stepped part 155 is not provided in the supporting portion 154. The distance between the signal processing IC 100 and the conductor 141 can be secured without being provided with the stepped part 155 when plate thickness of the conductor 140 can be increased and the stepped part 143 can be increased by the half-blanking process, or when a large step can be formed through bending. Other configuration of the current sensor 10 according to the second embodiment may be the same as the configuration of the current sensor 10 according to the first embodiment. Therefore, the current sensor 10 according to the second embodiment has similar advantages as the current sensor 10 according to the first embodiment. With the primary conductor having a shape such as in Patent document 1, since the current is divided into two paths and flows in the same direction, the magnetic field that passes through the magnetic sensor may not be able to be effectively improved. Therefore, the sensitivity of the magnetic sensor may not be able to be improved, and the S/N ratio may not be able to be effectively improved. On the other hand, according to the current sensor 10 described above, the sensitivity of the current sensor 10 can be improved and the S/N ratio can be effectively improved.

While the present invention has been described by way of the embodiments, the technical scope of the present invention is not limited to the scope described in the above-described embodiments. It is apparent to persons skilled in the art that various alterations or improvements can be made to the above-described embodiments. It is also apparent from description of the claims that the embodiments to which such modifications or improvements are made may be included in the technical scope of the present invention.

It should be noted that each process of the operations, procedures, steps, stages, and the like performed by the apparatus, system, program, and method shown in the claims, specification, or drawings can be executed in any order as long as the order is not indicated by "prior to", "before", or the like and as long as the output from a previous process is not used in a later process. Even if the operation flow is described using phrases such as "first" or "next" for the sake of convenience in the claims, specification, or drawings, it does not necessarily mean that the process must be performed in this order.

(Item 1)

A current sensor comprising:

a first lead frame having a first terminal portion;

a signal processing IC with a second face supported by a first face of the first lead frame, the signal processing IC being electrically connected to the first lead frame;

a first magnetoelectric conversion element and a second magnetoelectric conversion element that output, to the signal processing IC, signals to be processed by the signal processing IC, the first magnetoelectric conversion element and the second magnetoelectric conversion element being configured separately from the signal processing IC and mounted on a first face of the signal processing IC, which is an opposite side of the second face of the signal processing IC; and a second lead frame having a second terminal portion that opposes the first terminal portion in a plan view, wherein at least a part of the second lead frame is arranged to oppose the first face of the signal processing IC, the second lead frame partially surrounds the first magnetoelectric conversion element and the second magnetoelectric conversion element in the plan view, and a measurement current to be measured by the first magnetoelectric conversion element and the second magnetoelectric conversion element flows through the second lead frame, wherein in the plan view, the first magnetoelectric conversion element and the second magnetoelectric conversion element are arranged to oppose each other with an intermediate portion, which is a part of the second lead frame, through which a current is caused to flow in a second direction that intersects with a first direction from the first magnetoelectric conversion element toward the second magnetoelectric conversion element, sandwiched therebetween, the first magnetoelectric conversion element is electrically connected to the signal processing IC via a plurality of first wires, each of the plurality of first wires extending in a direction on a side different from the second magnetoelectric conversion element in the plan view, and is electrically connected to the signal processing IC without traversing the second lead frame, and the second magnetoelectric conversion element is electrically connected to the signal processing IC via a plurality of second wires, each of the plurality of second wires extending in a direction on a side different from the first magnetoelectric conversion element in the plan view, and is electrically connected to the signal processing IC without traversing the second lead frame.

(Item 2)

The current sensor according to item 1, wherein the second terminal portion has a pair of terminals, the second lead frame has:

a first portion extending from one of the pair of terminals to a side of the first terminal portion;

a second portion extending from another of the pair of terminals to a side of the first terminal portion; and a linking portion that links an end portion of the first portion to an end portion of the second portion, the first magnetoelectric conversion element is surrounded by the first portion, the linking portion, and the second portion in the plan view, the intermediate portion is the second portion or the linking portion, a distance between the first magnetoelectric conversion element and the intermediate portion is shorter than a distance between the first magnetoelectric conversion element and the second lead frame in the second direction, and a distance between the second magnetoelectric conversion element and the intermediate portion is shorter than a distance between the second magnetoelectric conversion element and the second lead frame in the second direction.

(Item 3)

The current sensor according to item 2, wherein the second lead frame further has:

a first extension portion that has only one end thereof bonded to the linking portion or the another of the pair of terminals when the second portion is the intermediate portion and only one end thereof bonded to the first portion when the linking portion is the intermediate portion, the first extension portion being adjacent to the second magnetoelectric conversion element; and a second extension portion that has only one end thereof bonded to the first extension portion, is not bonded at other places in the second lead frame, and is adjacent to the second magnetoelectric conversion element.

(Item 4)

The current sensor according to item 2, wherein a width of the intermediate portion in the first direction is equal to or less than a width of the first portion in a direction intersecting with a direction in which the measurement current flows.

(Item 5)

The current sensor according to item 2, wherein when the intermediate portion is the second portion, the first direction is a direction intersecting with a direction connecting the second terminal portion and the first terminal portion.

(Item 6)

The current sensor according to item 5, wherein a width of the linking portion in the second direction is equal to or less than a width of the first portion in the first direction.

(Item 7)

The current sensor according to item 1, wherein a width of the signal processing IC in a direction from the second terminal portion toward the first terminal portion is longer than a width of the signal processing IC in a direction intersecting in the plan view with the direction from the second terminal portion toward the first terminal portion.

(Item 8)

The current sensor according to item 1, wherein the first lead frame has an end surface on a virtual line that passes through a center of the first magnetoelectric conversion element and a center of the second magnetoelectric conversion element in the plan view.

(Item 9)

The current sensor according to item 1, wherein when a distance between a center of the first magnetoelectric conversion element and a center of the second magnetoelectric conversion element is defined as L and a thickness of the second lead frame is defined as Ta, a distance H between the signal processing IC and the second lead frame in a thickness direction satisfies:

$$0.01\ \text{mm} < H < 3 \times L - 0.5 \times Ta.$$

(Item 10)

The current sensor according to item 9, wherein when a width of the first magnetoelectric conversion element and the second magnetoelectric conversion element in the first direction is defined as Wb, the following is satisfied:

$$0.5 \times Ta + Wb < L.$$

(Item 11)

The current sensor according to item 9, wherein when a height from the first face of the signal processing IC to magnetosensitive surfaces of the first magnetoelectric conversion element and the second magnetoelectric conversion element is defined as Tb and a width in the first direction is defined as Wb, the following is satisfied:

$$Tb \leq 3 \times Wb.$$

(Item 12)

The current sensor according to item 11 wherein the following is satisfied:

$$H \leq 3 \times Wb + 0.5 \times Ta.$$

(Item 13)

The current sensor according to item 1, wherein the first lead frame has a first stepped part that is recessed in a direction in which a supporting portion that supports the signal processing IC moves away from the second lead frame in a thickness direction.

(Item 14)

The current sensor according to item 1, wherein the second lead frame has a second stepped part that protrudes in a direction in which an opposing portion that opposes the signal processing IC moves away from the signal processing IC in a thickness direction.

(Item 15)

The current sensor according to item 14, wherein the second stepped part protrudes in the thickness direction by greater than 0 times and 0.6 times or less a thickness of the second lead frame relative to the second terminal portion.

(Item 16)

The current sensor according to item 1, wherein a wiring included in a top layer on a side of the first face of the signal processing IC is arranged at a position that does not overlap with the first magnetoelectric conversion element and the second magnetoelectric conversion element in a thickness direction, or a wiring included in a top layer on a side of the first face of the signal processing IC is arranged at a position that overlaps with the first magnetoelectric conversion element and the second magnetoelectric conversion element in the thickness direction, and has a width that overlaps with all of the first magnetoelectric conversion element and the second magnetoelectric conversion element in the plan view.

(Item 17)

The current sensor according to item 1 further comprising an encapsulating part that encapsulates, with mold resin, portions of the first lead frame other than an exposed portion of the first terminal portion, portions of the second lead frame other than an exposed portion of the second terminal portion, the signal processing IC, the first magnetoelectric conversion element, and the second magnetoelectric conversion element with the second lead frame being spaced apart from the first lead frame, the signal processing IC, the first magnetoelectric conversion element, and the second magnetoelectric conversion element.

(Item 18)

The current sensor according to item 17, wherein a first height of the encapsulating part in a thickness direction in a face, on a same side as the first face of the signal processing IC, of the first terminal portion at a position where the first terminal portion intersects with a first side surface of the encapsulating part from which it is exposed and a second height of the encapsulating part in the thickness direction in a face, on a same side as the second face of the signal processing IC, of the second terminal portion at a position where the second terminal portion intersects with a second side surface of the encapsulating part from which it is exposed are same, or the first height is lower than the second height.

(Item 19)

The current sensor according to item 1, wherein the first magnetoelectric conversion element, the second magnetoelectric conversion element, and the intermediate portion are rectangular in the plan view, and in the plan view, a wire and an element do not exist in respective regions between a side surface, which opposes the intermediate portion, of each of the first magnetoelectric conversion element and the second magnetoelectric conversion element and respective side surfaces of the intermediate portion, each opposing the first magnetoelectric conversion element and the second magnetoelectric conversion element.

(Item 20)

A current sensor comprising:

a first lead frame having a first terminal portion;

a signal processing IC with a second face supported by a first face of the first lead frame, the signal processing IC being electrically connected to the first lead frame;

a first magnetoelectric conversion element and a second magnetoelectric conversion element that output, to the signal processing IC, signals to be processed by the signal processing IC, the first magnetoelectric conversion element and the second magnetoelectric conversion element being configured separately from the signal processing IC and mounted on a first face of the signal processing IC, which is an opposite side of the second face of the signal processing IC; and a second lead frame having a second terminal portion that opposes the first terminal portion in a plan view, wherein at least a part of the second lead frame is arranged to oppose the first face of the signal processing IC, the second lead frame partially surrounds the first magnetoelectric conversion element and the second magnetoelectric conversion element in the plan view, and a measurement current to be measured by the first magnetoelectric conversion element and the second magnetoelectric conversion element flows through the second lead frame, wherein in the plan view, the first magnetoelectric conversion element and the second magnetoelectric conversion element are arranged to oppose each other across an intermediate portion, which is a part of the second lead frame, through which a current is caused to flow in a second direction that intersects with a first direction from the first magnetoelectric conversion element toward the second magnetoelectric conversion element, the first magnetoelectric conversion element is electrically connected to the signal processing IC via a plurality of first wires that do not traverse the second lead frame, the second magnetoelectric conversion element is electrically connected to the signal processing IC via a plurality of second wires that do not traverse the second lead frame, the second terminal portion has a pair of terminals, the second lead frame has:

a first portion extending from one of the pair of terminals to a side of the first terminal portion;

a second portion extending from another of the pair of terminals to the side of the first terminal portion; and a linking portion that links an end portion of the first portion to an end portion of the second portion, wherein the first magnetoelectric conversion element is surrounded by the first portion, the linking portion, and the second portion in the plan view, the intermediate portion is the second portion or the linking portion, a distance between the first magnetoelectric conversion element and the intermediate portion is shorter than a distance between the first magnetoelectric conversion element and the second lead frame in the second direction, and a distance between the second magnetoelectric conversion element and the intermediate portion is shorter than a distance between the second magnetoelectric conversion element and the second lead frame in the second direction.

(Item 21)

The current sensor according to item 20, wherein when the intermediate portion is the second portion, a width of the intermediate portion in the first direction is equal to or less than a width of the linking portion in the second direction, and when the intermediate portion is the linking portion, a width of the intermediate portion in the first direction is equal to or less than a width of the second portion in the second direction.

(Item 22)

A current sensor comprising:

a first lead frame having a first terminal portion;

a signal processing IC with a second face supported by a first face of the first lead frame, the signal processing IC being electrically connected to the first lead frame;

a first magnetoelectric conversion element and a second magnetoelectric conversion element that output, to the signal processing IC, signals to be processed by the signal processing IC, the first magnetoelectric conversion element and the second magnetoelectric conversion element being configured separately from the signal processing IC and mounted on a first face of the signal processing IC, which is an opposite side of the second face of the signal processing IC; and a second lead frame having a second terminal portion that opposes the first terminal portion in a plan view, wherein at least a part of the second lead frame is arranged to oppose the first face of the signal processing IC, the second lead frame partially surrounds the first magnetoelectric conversion element and the second magnetoelectric conversion element in the plan view, and a measurement current to be measured by the first magnetoelectric conversion element and the second magnetoelectric conversion element flows through the second lead frame, wherein in the plan view, the first magnetoelectric conversion element and the second magnetoelectric conversion element are arranged to oppose each other across an intermediate portion, which is a part of the second lead frame, through which a current is caused to flow in a second direction that intersects with a first direction from the first magnetoelectric conversion element toward the second magnetoelectric conversion element, the first magnetoelectric conversion element is electrically connected to the signal processing IC via a plurality of first wires that do not traverse the second lead frame, the second magnetoelectric conversion element is electrically connected to the signal processing IC via a plurality of second wires that do not traverse the second lead frame, and a width of the signal processing IC in a direction from the second terminal portion toward the first terminal portion is longer than a width of the signal processing IC in a direction intersecting in the plan view with the direction from the second terminal portion toward the first terminal portion.

(Item 23)

The current sensor according to item 22, wherein when a height from the first face of the signal processing IC to magnetosensitive surfaces of the first magnetoelectric conversion element and the second magnetoelectric conversion element is defined as Tb and a width in the first direction is defined as Wb, the following is satisfied:

$$0.050\ \text{mm} \le Tb \le 3 \times Wb.$$

(Item 24)

A current sensor comprising:

a first lead frame having a first terminal portion;

a signal processing IC with a second face supported by a first face of the first lead frame, the signal processing IC being electrically connected to the first lead frame;

a first magnetoelectric conversion element and a second magnetoelectric conversion element that output, to the signal processing IC, signals to be processed by the signal processing IC, the first magnetoelectric conversion element and the second magnetoelectric conversion element being configured separately from the signal processing IC and mounted on a first face of the signal processing IC, which is n opposite side of the second face of the signal processing IC;

a second lead frame having a second terminal portion that opposes the first terminal portion in a plan view, wherein at least a part of the second lead frame is arranged to oppose the first face of the signal processing IC, the second lead frame partially surrounds the first magnetoelectric conversion element and the second magnetoelectric conversion element in the plan view, and a measurement current to be measured by the first magnetoelectric conversion element and the second magnetoelectric conversion element flows through the second lead frame, a plurality of first wires that electrically connect the first magnetoelectric conversion element and the signal processing IC;

a plurality of second wires that electrically connect the second magnetoelectric conversion element and the signal processing IC; and a plurality of first pads that physically connect respectively to the plurality of first wires, and a plurality of second pads that physically connect respectively to the plurality of second wires, the plurality of first pads and the plurality of second pads being on the signal processing IC, wherein in the plan view, the first magnetoelectric conversion element and the second magnetoelectric conversion element are arranged to oppose each other across an intermediate portion, which is a part of the second lead frame, through which a current is caused to flow in a second direction that intersects with a first direction from the first magnetoelectric conversion element toward the second magnetoelectric conversion element, each of the plurality of first pads and the plurality of second pads does not overlap with the second lead frame in the plan view, and the plurality of first pads are on a side of the first terminal portion and/or a side of the second terminal portion relative to the first magnetoelectric conversion element in the plan view, and the plurality of second pads are on the side of the first terminal portion and/or the side of the second terminal portion relative to the second magnetoelectric conversion element in the plan view.

EXPLANATION OF REFERENCES

10: current sensor;
20*a*, 20*b*: magnetoelectric conversion element;
22*a*, 22*b*, 108: wire;

23*a*, 23*b*: pad;
100: signal processing IC;
130: encapsulating part;
140: lead frame;
141: conductor;
142: terminal portion;
142*a*, 142*b*: terminal;
143: stepped part;
150: lead frame
151: IC suspension part;
152: terminal portion;
152*a*: terminal;
154: supporting portion;
155: stepped part;
156: virtual line;
1411: first portion;
1412: second portion:
1413: linking portion;
1414, 1414*a*, 1415, 1415*a*, 1416, 1416*a*: extension portion.

What is claimed is:

1. A current sensor comprising:
a first lead frame having a first terminal portion;
a signal processing IC with a second face supported by a first face of the first lead frame, the signal processing IC being electrically connected to the first lead frame;
a first magnetoelectric conversion element and a second magnetoelectric conversion element that output, to the signal processing IC, signals to be processed by the signal processing IC, the first magnetoelectric conversion element and the second magnetoelectric conversion element being configured separately from the signal processing IC and mounted on a first face of the signal processing IC, which is an opposite side of the second face of the signal processing IC; and
a second lead frame having a second terminal portion that opposes the first terminal portion in a plan view, wherein at least a part of the second lead frame is arranged to oppose the first face of the signal processing IC, the second lead frame partially surrounds the first magnetoelectric conversion element and the second magnetoelectric conversion element in the plan view, and a measurement current to be measured by the first magnetoelectric conversion element and the second magnetoelectric conversion element flows through the second lead frame,
wherein in the plan view, the first magnetoelectric conversion element and the second magnetoelectric conversion element are arranged to oppose each other with an intermediate portion, which is a part of the second lead frame, through which a current is caused to flow in a second direction that intersects with a first direction from the first magnetoelectric conversion element toward the second magnetoelectric conversion element, sandwiched therebetween,
the first magnetoelectric conversion element is electrically connected to the signal processing IC via a plurality of first wires, each of the plurality of first wires extending in a direction on a side different from the second magnetoelectric conversion element in the plan view, and is electrically connected to the signal processing IC without traversing the second lead frame, and
the second magnetoelectric conversion element is electrically connected to the signal processing IC via a plurality of second wires, each of the plurality of second wires extending in a direction on a side different from the first magnetoelectric conversion element in the plan view, and is electrically connected to the signal processing IC without traversing the second lead frame.

2. The current sensor according to claim 1, wherein
the second terminal portion has a pair of terminals,
the second lead frame has:
a first portion extending from one of the pair of terminals to a side of the first terminal portion;
a second portion extending from another of the pair of terminals to the side of the first terminal portion; and
a linking portion that links an end portion of the first portion to an end portion of the second portion,
the first magnetoelectric conversion element is surrounded by the first portion, the linking portion, and the second portion in the plan view,
the intermediate portion is the second portion or the linking portion,
a distance between the first magnetoelectric conversion element and the intermediate portion is shorter than a distance between the first magnetoelectric conversion element and the second lead frame in the second direction, and
a distance between the second magnetoelectric conversion element and the intermediate portion is shorter than a distance between the second magnetoelectric conversion element and the second lead frame in the second direction.

3. The current sensor according to claim 2, wherein the second lead frame further has:
a first extension portion that has only one end thereof bonded to the linking portion or the another of the pair of terminals when the second portion is the intermediate portion and only one end thereof bonded to the first portion when the linking portion is the intermediate portion, the first extension portion being adjacent to the second magnetoelectric conversion element; and
a second extension portion that has only one end thereof bonded to the first extension portion, is not bonded at other places in the second lead frame, and is adjacent to the second magnetoelectric conversion element.

4. The current sensor according to claim 2, wherein a width of the intermediate portion in the first direction is equal to or less than a width of the first portion in a direction intersecting with a direction in which the measurement current flows.

5. The current sensor according to claim 2, wherein when the intermediate portion is the second portion, the first direction is a direction intersecting with a direction connecting the second terminal portion and the first terminal portion.

6. The current sensor according to claim 5, wherein a width of the linking portion in the second direction is equal to or less than a width of the first portion in the first direction.

7. The current sensor according to claim 1, wherein a width of the signal processing IC in a direction from the second terminal portion toward the first terminal portion is longer than a width of the signal processing IC in a direction intersecting in the plan view with the direction from the second terminal portion toward the first terminal portion.

8. The current sensor according to claim 1, wherein the first lead frame has an end surface on a virtual line that passes through a center of the first magnetoelectric conversion element and a center of the second magnetoelectric conversion element in the plan view.

9. The current sensor according to claim 1, wherein when a distance between a center of the first magnetoelectric conversion element and a center of the second magnetoelectric conversion element is defined as L and a thickness of the second lead frame is defined as Ta, a distance H between the signal processing IC and the second lead frame in a thickness direction satisfies:

$$0.01\ \text{mm} < H < 3 \times L - 0.5 \times Ta.$$

10. The current sensor according to claim 9, wherein when a width of the first magnetoelectric conversion element and the second magnetoelectric conversion element in the first direction is defined as Wb, the following is satisfied:

$$0.5 \times Ta + Wb < L.$$

11. The current sensor according to claim 9, wherein when a height from the first face of the signal processing IC to magnetosensitive surfaces of the first magnetoelectric conversion element and the second magnetoelectric conversion element is defined as Tb and a width in the first direction is defined as Wb, the following is satisfied:

$$Tb \leq 3 \times Wb.$$

12. The current sensor according to claim 11, wherein the following is satisfied:

$$H \leq 3 \times Wb + 0.5 \times Ta.$$

13. The current sensor according to claim 1, wherein the first lead frame has a first stepped part that is recessed in a direction in which a supporting portion that supports the signal processing IC moves away from the second lead frame in a thickness direction.

14. The current sensor according to claim 1, wherein the second lead frame has a second stepped part that protrudes in a direction in which an opposing portion that opposes the signal processing IC moves away from the signal processing IC in a thickness direction.

15. The current sensor according to claim 1, wherein a wiring included in a top layer on a side of the first face of the signal processing IC is arranged at a position that does not overlap with the first magnetoelectric conversion element and the second magnetoelectric conversion element in a thickness direction, or a wiring included in a top layer on a side of the first face of the signal processing IC is arranged at a position that overlaps with the first magnetoelectric conversion element and the second magnetoelectric conversion element in the thickness direction, and has a width that overlaps with all of the first magnetoelectric conversion element and the second magnetoelectric conversion element in the plan view.

16. The current sensor according to claim 1 further comprising an encapsulating part that encapsulates, with mold resin, portions of the first lead frame other than an exposed portion of the first terminal portion, portions of the second lead frame other than an exposed portion of the second terminal portion, the signal processing IC, the first magnetoelectric conversion element, and the second magnetoelectric conversion element with the second lead frame being spaced apart from the first lead frame, the signal processing IC, the first magnetoelectric conversion element, and the second magnetoelectric conversion element.

17. The current sensor according to claim 16, wherein a first height of the encapsulating part in a thickness direction in a face, on a same side as the first face of the signal processing IC, of the first terminal portion at a position where the first terminal portion intersects with a first side surface of the encapsulating part from which it is exposed and a second height of the encapsulating part in the thickness direction in a face, on a same side as the second face of the signal processing IC, of the second terminal portion at a position where the second terminal portion intersects with a second side surface of the encapsulating part from which it is exposed are same, or the first height is lower than the second height.

18. The current sensor according to claim 1, wherein the first magnetoelectric conversion element, the second magnetoelectric conversion element, and the intermediate portion are rectangular in the plan view, and in the plan view, a wire and an element do not exist in respective regions between a side surface, which opposes the intermediate portion, of each of the first magnetoelectric conversion element and the second magnetoelectric conversion element and respective side surfaces of the intermediate portion, each opposing the first magnetoelectric conversion element and the second magnetoelectric conversion element.

19. A current sensor comprising:

a first lead frame having a first terminal portion;

a signal processing IC with a second face supported by a first face of the first lead frame, the signal processing IC being electrically connected to the first lead frame;

a first magnetoelectric conversion element and a second magnetoelectric conversion element that output, to the signal processing IC, signals to be processed by the signal processing IC, the first magnetoelectric conversion element and the second magnetoelectric conversion element being configured separately from the signal processing IC and mounted on a first face, which is an opposite side of the second face of the signal processing IC; and a second lead frame having a second terminal portion that opposes the first terminal portion in a plan view, wherein at least a part of the second lead frame is arranged to oppose the first face of the signal processing IC, the second lead frame partially surrounds the first magnetoelectric conversion element and the second magnetoelectric conversion element in the plan view, and a measurement current to be measured by the first magnetoelectric conversion element and the second magnetoelectric conversion element flows through the second lead frame, wherein in the plan view, the first magnetoelectric conversion element and the second magnetoelectric conversion element are arranged to oppose each other across an intermediate portion, which is a part of the second lead frame, through which a current is caused to flow in a second direction that intersects with a first direction from the first magnetoelectric conversion element toward the second magnetoelectric conversion element, the first magnetoelectric conversion element is electrically connected to the signal processing IC via a plurality of first wires that do not traverse the second lead frame, the second magnetoelectric conversion element is electrically connected to the signal processing IC via a plurality of second wires that do not traverse the second lead frame, the second terminal portion has a pair of terminals, the second lead frame has:

a first portion extending from one of the pair of terminals to a side of the first terminal portion;

a second portion extending from another of the pair of terminals to the side of the first terminal portion; and a linking portion that links an end portion of the first portion to an end portion of the second portion, wherein the first magnetoelectric conversion element is surrounded by the first portion, the linking portion, and the second portion in the plan view, the intermediate portion is the second portion or the linking portion, a distance between the first magnetoelectric conversion element and the intermediate portion is shorter than a distance between the first magnetoelectric conversion element and the second lead frame in the second direction, and a distance between the second magnetoelectric conversion element and the intermediate portion is shorter than a distance between the second magnetoelectric conversion element and the second lead frame in the second direction.

20. A current sensor comprising:

a first lead frame having a first terminal portion;

a signal processing IC with a second face supported by a first face of the first lead frame, the signal processing IC being electrically connected to the first lead frame;

a first magnetoelectric conversion element and a second magnetoelectric conversion element that output, to the signal processing IC, signals to be processed by the signal processing IC, the first magnetoelectric conversion element and the second magnetoelectric conversion element being configured separately from the signal processing IC and mounted on a first face of the signal processing IC, which is an opposite side of the second face of the signal processing IC; and a second lead frame having a second terminal portion that opposes the first terminal portion in a plan view, wherein at least a part of the second lead frame is arranged to oppose the first face of the signal processing IC, the second lead frame partially surrounds the first magnetoelectric conversion element and the second magnetoelectric conversion element in the plan view, and a measurement current to be measured by the first magnetoelectric conversion element and the second magnetoelectric conversion element flows through the second lead frame, wherein in the plan view, the first magnetoelectric conversion element and the second magnetoelectric conversion element are arranged to oppose each other across an intermediate portion, which is a part of the second lead frame, through which a current is caused to flow in a second direction that intersects with a first direction from the first magnetoelectric conversion element toward the second magnetoelectric conversion element, the first magnetoelectric conversion element is electrically connected to the signal processing IC via a plurality of first wires that do not traverse the second lead frame, the second magnetoelectric conversion element is electrically connected to the signal processing IC via a plurality of second wires that do not traverse the second lead frame, and a width of the signal processing IC in a direction from the second terminal portion toward the first terminal portion is longer than a width of the signal processing IC in a direction that intersects in the plan view with a direction from the second terminal portion toward the first terminal portion.

* * * * *